(12) United States Patent
Cardella

(10) Patent No.: US 6,184,504 B1
(45) Date of Patent: Feb. 6, 2001

(54) TEMPERATURE CONTROL SYSTEM FOR ELECTRONIC DEVICES

(75) Inventor: Mark A. Cardella, Palo Alto, CA (US)

(73) Assignee: Silicon Thermal, Inc., Mountain View, CA (US)

( * ) Notice: Under 35 U.S.C. 154(b), the term of this patent shall be extended for 0 days.

(21) Appl. No.: 09/291,171

(22) Filed: Apr. 13, 1999

(51) Int. Cl.[7] ...................................................... H05B 1/02
(52) U.S. Cl. .......................... 219/513; 219/209; 219/490; 219/494; 219/498; 324/760; 438/715
(58) Field of Search ................................ 219/121.43, 497, 219/501, 508, 494, 505, 209, 210, 513, 490, 498; 324/760, 750–758; 438/660, 715

(56) References Cited

U.S. PATENT DOCUMENTS

| | | | |
|---|---|---|---|
| 4,696,578 | * | 9/1987 | Mansuria et al. ....................... 374/45 |
| 5,205,132 | * | 4/1993 | Fu ........................................... 62/208 |
| 5,325,052 | * | 6/1994 | Yamashita ............................ 324/760 |
| 5,420,521 | * | 5/1995 | Jones ................................... 324/760 |

* cited by examiner

Primary Examiner—Mark Paschall
(74) Attorney, Agent, or Firm—Janah & Associates; Ashok K. Janah

(57) ABSTRACT

An apparatus 10 for controlling a temperature of an electronic device 40, comprising a temperature regulated surface 100 and an actuator 105 adapted to alternately pulse the temperature regulated surface 100 and electronic device 40 between thermally coupled and uncoupled positions, whereby a temperature of the electronic device 40 is controlled.

32 Claims, 3 Drawing Sheets

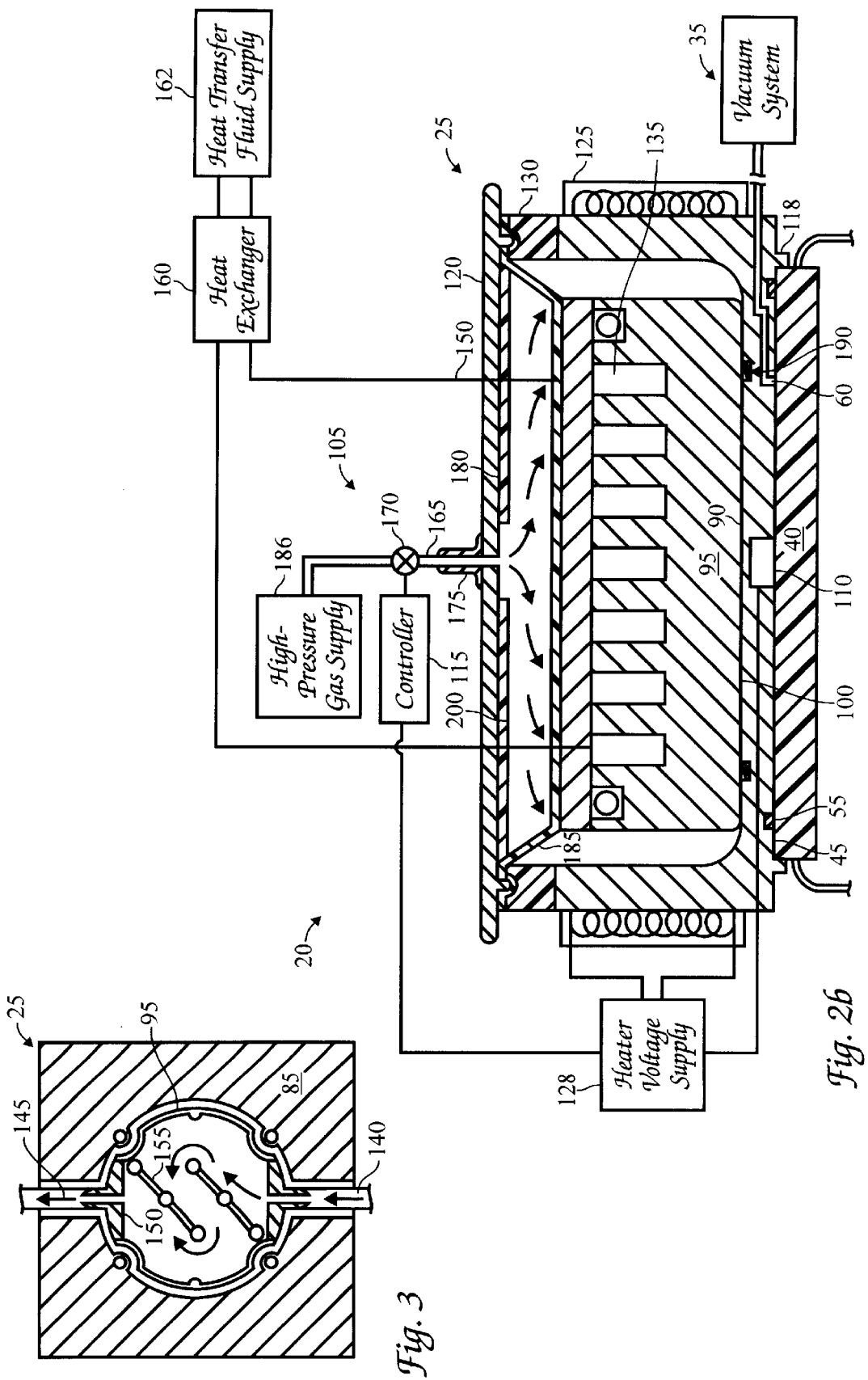

TEMPERATURE CONTROL SYSTEM FOR ELECTRONIC DEVICES

BACKGROUND

The present invention relates to a temperature control system for controlling the temperature of an electronic device.

Advances in semiconductor technology have led to the development of a new generation of electronic devices, such as integrated circuits, having an increasingly larger number of active elements, higher circuit complexity, smaller area, and more closely spaced wiring. These attributes generate more heat in the electronic device and provide less opportunity for heat dissipation. This results in higher operating temperatures and consequently lower reliability, especially for integrated circuits that operate at high frequencies and high heat loads. The small size of the integrated circuit and the tightly packed electrical circuitry of surrounding equipment makes it even more difficult to cool the integrated circuit with conventional fans or heat sinks. In addition, the integrated circuits can experience large temperature fluctuations which affect their performance attributes, such as the timing of mathematical, data transfer, and read/write operations, especially at high frequencies. Variations in temperature of as little as ±5° C. can cause a change in operating frequency of as much as 20 MHZ which significantly affects the performance of the chip. Thus, it is desirable to control the temperature of an integrated circuit during operation.

Prior art methods for controlling the temperature of an integrated circuit used a combination of heat sinks attached to the integrated circuit and cooling fans that directed a flow of air across the heat sinks. However, it is difficult to remove a large amount of heat by these methods. First, the thermal mass of the heat sink increases the time it takes for the integrated circuit to reach the desired temperature. Second, once the integrated circuit has been raised to its desired temperature, the relatively low specific heat capacity of air limits the ability of the cooling system to remove excess heat at a sufficiently high rate. It is particularly difficult for these temperature control systems to quickly respond to the large changes in temperatures that can occur in high performance chips.

Another problem associated with the prior art methods that occurs during testing of the integrated circuit chip is that the bulky heat sinks and cooling fans interfere with the operation of a robot handler that is used during testing. The robot handler has an articulated arm with a vacuum port to pick up an integrated circuit chip from a rack and hold the chip in a test socket. While power is applied to the integrated circuit, various read/write operations are performed on the integrated circuit. The robot handler remains in contact with the integrated circuit during testing. Typically, one or more heat sinks and cooling fans are attached to the arm of the robot handler which make the arm bulky and impede its ability to pick up individual integrated circuits and accurately position them in the test socket. Furthermore, the size of the heat sinks and cooling fans makes it difficult to retrofit existing robot handlers. Thus, it is desirable to have a temperature control system that is compact, lightweight, and which can be easily retrofitted to existing testing systems.

Thus, there is a need for a temperature control system that can maintain an electronic device at predetermined temperatures. It is also desirable for the temperature control system to rapidly raise and lower the temperature of the electronic device. It is further desirable for the temperature control system to be compact, lightweight, and adaptable for use with existing automated testers.

SUMMARY

The present invention is related to an apparatus for controlling the temperature of an electronic device. The apparatus includes a temperature control system comprising a temperature regulated surface and an actuator adapted to alternate the temperature regulated surface and the electronic device between thermally coupled and uncoupled positions, whereby a temperature of the electronic device is controlled.

In another embodiment, the present invention comprises a temperature control head for controlling a temperature of an electronic device, the temperature control head comprising a thermal conductor having a contact surface adapted to contact the electronic device and having a heat transfer surface. A heat transfer member comprises a temperature regulated surface. An actuator is adapted to alternate the heat transfer surface and the temperature regulated surface between thermally coupled and uncoupled positions to control the temperature of the electronic device.

In another embodiment, the present invention comprises a temperature control head comprising means for holding the electronic device, means for controlling a temperature of a temperature regulated surface, and means for alternating the temperature regulated surface and electronic device between a thermally coupled position in which heat transfer occurs therebetween, and an uncoupled position in which the rate of heat transfer is reduced.

In another aspect, the present invention is also directed to a method of controlling the temperature of an electronic device, the method comprising the step of pulsing the electronic device and a heat transfer member between a thermal coupled position in which heat is transferred therebetween, and a uncoupled position in which the rate of heat transfer is reduced. For example, the method can comprise the steps of holding an electronic device against a thermal conductor, regulating the temperature of a heat transfer member, and alternating the heat transfer member and the thermal conductor between a thermally coupled position in which the heat transfer member and the thermal conductor are thermally coupled to allow heat transfer therebetween, and an uncoupled position in which the heat transfer member and the thermal conductor are uncoupled to reduce a rate of heat transfer therebetween.

DRAWINGS

These and other features, aspects, and advantages of the present invention will become better understood with regard to the following description, appended claims, and accompanying drawings which illustrate examples of the invention, where:

FIG. 2b is another view of the head of FIG. 2a, showing the thermal conductor and heat transfer member in a thermally coupled position; and FIG. 3 is a schematic partial sectional top view of another embodiment of a temperature control head comprising a thermal conductor and a heat transfer member comprising a channel and fins.

DESCRIPTION

The present invention is suitable for controlling the temperature of an electronic device by rapidly heating or cooling the electronic device. Although the present invention is illustrated in the context of controlling the temperature of an integrated circuit during testing, the present invention can be used to control the temperature of a variety of other electronic components including flat panels, SCRs, thyristors, and rectifiers, in other environments, for other purposes, and without limitations.

Figure 1:
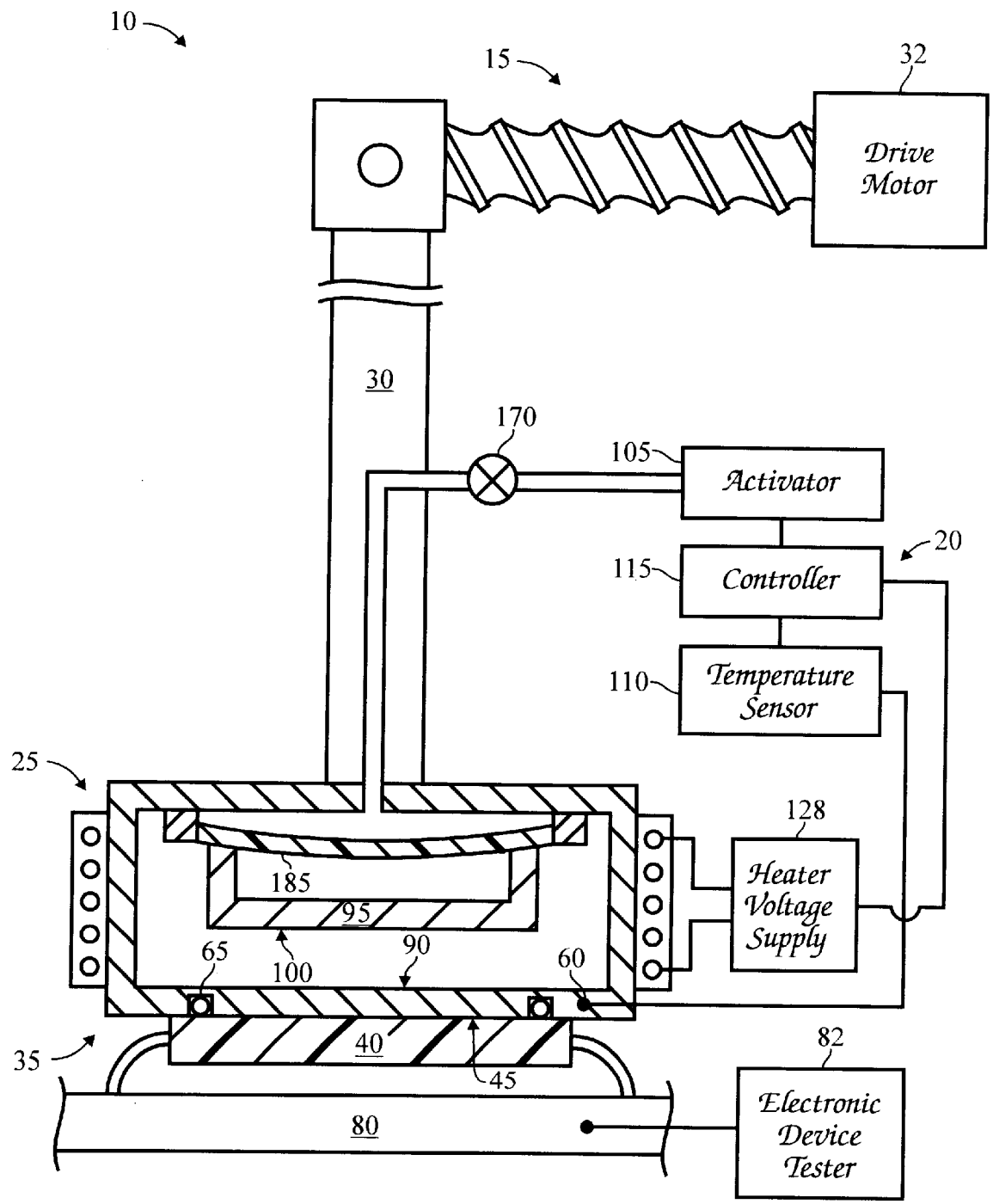
FIG. 1 is a schematic view of a testing apparatus comprising a temperature control system according to the present invention.
Figure 2A:
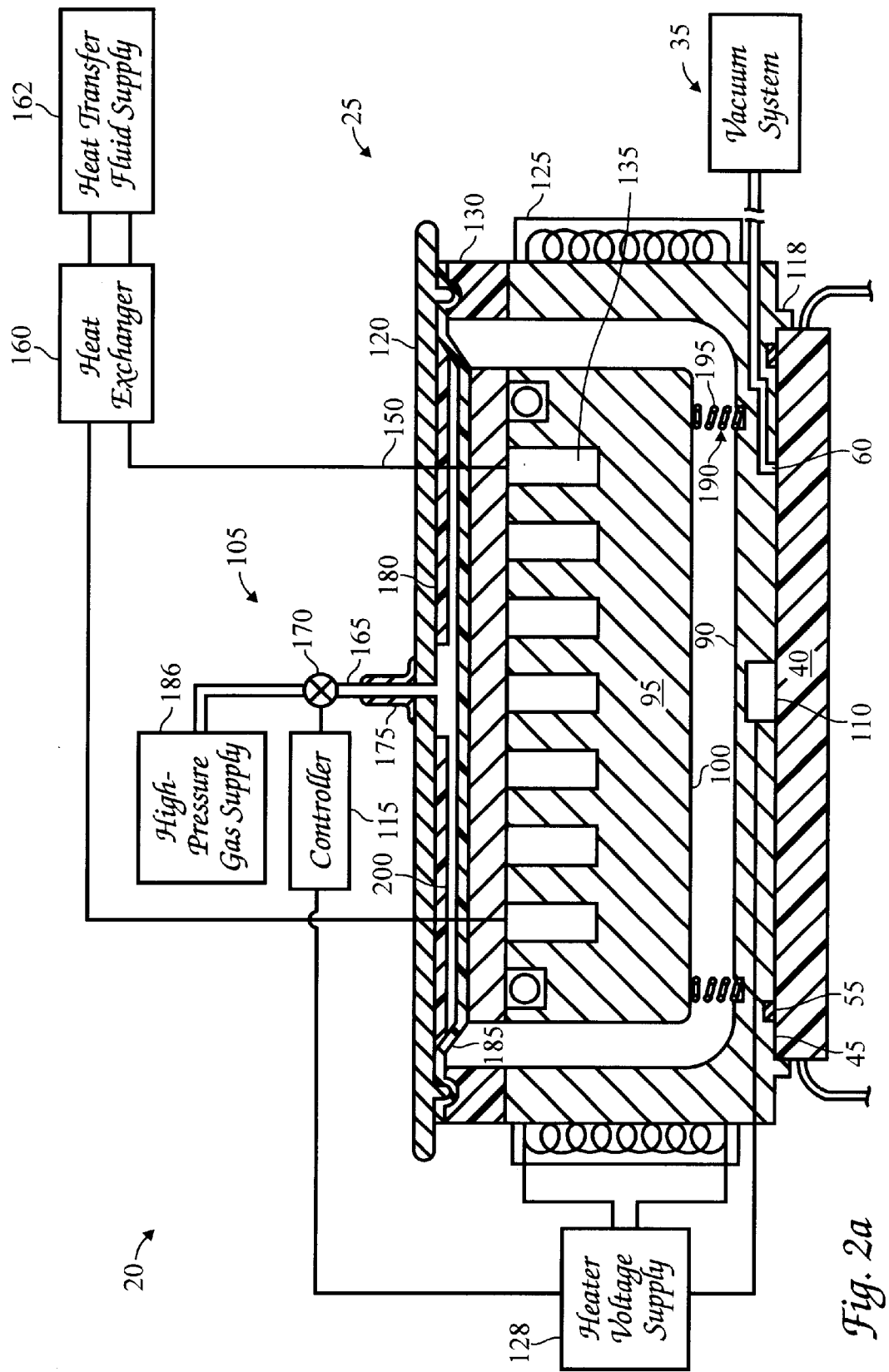
FIG. 2a is a schematic sectional side view of a temperature control head showing the thermal conductor and heat transfer member in an uncoupled position.

FIG. 1 illustrates an apparatus 10 that is used to pick up and test operation of an integrated circuit at different temperatures. Generally, the apparatus 10 comprises a robot handler 15, a temperature control system 20, and temperature control head 25 according to the present invention. The robot handler 15 comprises an articulated arm 30 powered by a drive motor 32 having the temperature control head 25 mounted thereon. The temperature control head 25 comprises a holding system 35 suitable for picking up and holding an electronic device 40 against a contact surface 45 of the temperature control head 25. Referring to FIG. 2a, suitable holding systems 35 include mechanical clamps and vacuum pickups that can serve as means for holding the electronic device 40. For example, a typical vacuum pickup comprises a vacuum gasket 55, such as silicon foam rubber gasket, at the contact surface 45 to press against and form an airtight seal with the electronic device 40. A vacuum port 60 passing through the contact surface 45 removes air held between the device 40 and the contact surface 45 to hold the electronic device 40 in place by a vacuum force. In operation, the robot handler 15 moves its arm 30 over an electronic device 40 in a tray (not shown), and the holding system 35 is activated so that the vacuum port 60 sucks a vacuum to pick up and hold the electronic device 40 in a test socket 80 via which power is applied and operational tests are performed on the device 40 by an electronic device tester 82. Suitable apparatus 10 having one or more of these features include an automated integrated circuit chip tester, such as the HP 93000, commercially available from Hewlett Packard of Palo Alto, Calif.; and an automated integrated circuit chip robot handler, such as a NS 5000, commercially available from Seiko Epson of Nagano, Japan.

The temperature of the electronic device 40 is maintained at or near a specified temperature by a temperature control system 20 of the present invention. FIGS. 2a and 2b illustrate an embodiment of a temperature control head 25 that is suitable for controlling the temperature of an electronic device 40 while undergoing testing. Generally, the temperature control head 25 includes a thermal conductor 95 having a contact surface 45 in contact with the electronic device 40, and a heat transfer surface 90 that is adapted to be thermally coupled with a temperature regulated surface 100 of a heat transfer member 95 whose temperature is regulated or preset to predefined levels.

An actuator 105 is provided to alternate the heat transfer member 95 and the thermal conductor 85 between (i) an uncoupled position in which the temperature regulated surface 100 and the heat transfer surface 90 are disengaged from one another to reduce heat transfer therebetween, as shown in FIG. 2a; and (ii) a thermally coupled position in which the temperature regulated surface 100 and heat transfer surface 90 are engaged to one another to provide good heat transfer therebetween, as shown in FIG. 2b. The temperature control system 20 controls the temperature of the electronic device 40 by alternating the temperature regulated surface 100 and electronic device 40 between thermally coupled and uncoupled positions. By controlling the rate at which the temperature regulated surface 100 is contacted against and withdrawn from contact with the electronic device 40 through the heat transferring medium of the heat transfer surface 90, the temperature of the electronic device 40 is maintained at a constant temperature within a small range of temperatures, even though the heat load of the electronic device 40 can vary considerably during its operation and testing. Thus, the actuator 105 is adapted to alternate the temperature regulated surface 100 and electronic device 40 between the thermally coupled and uncoupled positions at a pulse rate sufficiently high to maintain the electronic device 40 in a predetermined range of controlled temperatures.

Optionally, a temperature sensor 110 detects the temperature of the electronic device 40 and passes a signal to a controller 115 that controls a rate of pulsing or commutation between the thermally coupled and uncoupled positions in relation to the temperature of the electronic device 40. The temperature sensor 110 comprises a thermocouple, optical sensor such as an infrared detector; or a sensor which detects temperature by measuring a change in resistance, such as a resistance temperature sensor (RTD) or thermistor. The temperature sensor 110 is mounted in close proximity to the electronic device 40 to accurately measure its temperature.

Particular aspects of the temperature control head 25 of the present invention will now be described. The thermal conductor 85 comprises a thermally conducting material, including a metal, such as aluminum or copper, or a thermally conducting ceramic, such as aluminum nitride or carbon. The thermal conductor 85 comprises a cylindrical, polygonal, triangulated, or multi-radial shape, depending upon the shape of the electronic device 40. The thermal conductor 85 is shaped and sized to provide a contact surface 45 which conforms to the shape of the package of the electronic device 40 in operation or undergoing testing. For example, when the electronic device 40 is a planar member with a polygonal cross-section, the contact surface 45 has a matching flat surface with a polygonal cross-section. In another example, the contact surface 45 can comprise a shallow indentation which conforms to the shape of the top surface as well as the sides of the electronic device 40 to align the electronic device 40 to the contact surface 45 and to increase the surface area through which heat is transferred. In addition, preferably, the contact surface 45 comprises plurality of alignment pins 118, as shown in FIG. 2a, for aligning the electronic device. More preferably, the alignment pins 118 are removable and can be screwed or press fitted in place to enable the contact surface 45 to be quickly adapted to fit a wide variety of electronic devices 40 with different shapes or sizes.

The heat transfer surface 90 of the thermal conductor 85 is shaped, sized, and made of a material that allows heat transfer at a rate that is greater than the highest rate at which heat will be produced by the electronic device 40 undergoing operation or testing. Preferably, the heat transfer surface 90 conforms to the temperature regulated surface 100 of the heat transfer member 95. Moreover, the heat transfer surface 90 can be recessed or protruding, such as a concave or convex hemispherical surface, to self-align with the heat transfer member 95 and increase the available heat transfer area. For example, in the embodiment shown in FIG. 2a, the thermal conductor 85 is U-shaped, and the heat transfer member 95 is shaped and sized to be within the legs of the U-shape. The thermal conductor 85 further comprises a top cover 120 which is connectable to the arm 30 of the robot handler 15. The thickness of thermally conducting material between the contact surface and heat transfer surface 90 is sufficiently thick to support the electronic device 40 without excessive flexing during use, and sufficiently thin to increase the transfer of heat between the electronic device 40 and the heat transfer member 95 in the thermally coupled position. Preferably, when the thermal conductor 85 is made from a metal, such as aluminum, a suitable thickness is from about 2 to about 4 mm.

In another version, the thermal conductor 85 comprises a heater 125 to raise the temperature of the electronic device 40 to a predetermined temperature at which the device 40 is tested. The heater 125 comprises a radiant or resistive heater having a sufficient heat output to quickly raise the temperature electronic device 40 to the desired temperature, such as a resistance heating element embedded in or adjacent to the thermal conductor 85. Preferably, the heater 125 comprises a layer of a ductile material having a resistance heating element embedded therein, and which is wrapped around the thermal conductor 85. More preferably, the heater 125 provides a heat output of from about 100 to about 150 Watts. Most preferably, the heater 125 is capable of raising the temperature of the electronic device 40 from room temperature to about 70° C. in less than about 4 seconds. The heater is powered by a heater power supply 128, as shown in FIG. 1.

The temperature control head 25 can further comprise a thermal insulator 130 between and separating the cover 120 which is connected or coupled to the robot arm from the thermal conductor 85. The thermal insulator 130 comprises a thermally insulating material which thermally isolates the thermal conductor 85 from the arm 30 of the robot handler 15, thereby enabling the electronic device 40 to be quickly heated or cooled to operating temperatures, without transferring excessive heat to the arm 30. Suitable materials include a ceramic material, such as aluminum oxide or mullite; or a polymer material, such as Teflon (™ DuPont de Nemours, Inc.).

Particular aspects of the heat transfer member 95 will now be described.

The heat transfer member 95 comprises a thermally conducting material, including a metal, such as aluminum or copper, or a high thermal conductivity ceramic material, such as aluminum nitride or carbon. The heat transfer member 95 is sized and shaped to provide a temperature regulated surface 100 which conforms to the heat transfer surface 90 of the thermal conductor 85 to maximize the rate of heat transfer between the heat transfer member 95 and the thermal conductor 85. Preferably, the temperature regulated surface 100 is able to transfer heat at a rate that is greater than the highest rate at which heat will be produced by the electronic device 40 undergoing testing. This is done to ensure that the temperature control head 25 is able to maintain the temperature of the electronic device 40 within a narrow range around the desired temperature. More preferably, the heat transfer surface 90 and the temperature regulated surface 100 have a surface roughness that is sufficiently smooth to enhance thermal coupling therebetween. The smooth surfaces ensure that the full contact area of the two surfaces are in thermal contact with one another to maximize heat transfer rates therebetween.

The heat transfer member 95 also comprises one or more channels 135 through which a heat transfer fluid is circulated to add or remove heat to maintain the temperature regulated surface 100 of the heat transfer member 95 at a specified temperature. By "heat transfer fluid" it is meant any gas or liquid that is capable of absorbing heat from or providing heat to the heat transfer member 95. The size, number, and arrangement of channels 135 are selected to transfer heat at a rate that is greater than the highest rate at which heat will be generated by the electronic device 40 undergoing testing. One suitable arrangement, shown in FIG. 3, comprises a plurality of interconnected channels 135 having an inlet 140 and an outlet 145 that terminate on the opposite sides of the heat transfer member 95. More preferably, the inlet 140 and outlet 145 of the channels terminate in tapered joint fittings 150 that are adapted for receiving a flexible line or hose used to supply fluid to the heat transfer member 95. The channels 135 can also comprise cooling fins 155 which reduces the rate at which the heat transfer fluid moves through the heat transfer member 95. The cooling fins 155 interrupt the smooth flow of coolant through the channels 135 to provide a more turbulent flow which increases the surface area of the heat transfer member 95 exposed to the heat transfer fluid. These effects increase the rate of heat transfer between the heat transfer member 95 and the heat transfer fluid. The turbulent flow also mixes hotter fluid with colder fluid to render the fluid temperature more uniform.

The heat transfer fluid circulated through the heat transfer member 95 is passed through a heat exchanger 160 that is remote from the electronic device 40 undergoing test, and which is adapted to add or remove heat to the transfer fluid as necessary to maintain the heat transfer member 95 at the specified temperature. For example, the heat transfer fluid can be cooled to a specified temperature to about 2° C. A heat transfer fluid supply 162 holds and supplies a heat transfer fluid, such as deionized water. Generally, the heat exchanger 160 comprises a pump for circulating the heat transfer fluid through the heat transfer member 95, a chiller including a radiator and a fan capable of blowing air through the radiator, and optionally, a refrigeration unit and/or a heater (not shown). In a preferred embodiment, the heat exchanger 160 is adjusted to provide heat transfer fluid to the heat transfer member 95 at a temperature that is below the desired operating temperature of the device so that the electronic device 40 may be regulated by controlling the frequency with which the thermal conductor 85 and the heat transfer member 95 are alternated between thermally coupled and uncoupled positions, or the length of time that they are in contact. Preferably, the heat exchanger 160 sufficiently cools the heat transfer fluid to yield a temperature of the heat transfer member 95 of from about 5 to about 25° C., and more preferably about 15° C. However, other embodiments are contemplated, including one version in which the heat exchanger 160 is capable of providing heat transfer fluid at an initially high temperature to heat the electronic device 40.

The actuator 105 comprises an assembly for actuating or moving one or more of the heat transfer member 95 or thermal conductor 85 between the thermally coupled position—in which the temperature regulated surface 100 and the heat transfer surface 90 are contacted against one another—and an uncoupled position, in which they are not. A suitable actuator 105 comprises an electrical, electromagnetic, pneumatic, or hydraulic system. Preferably, the actuator 105 comprises a pneumatic assembly that is operated by a pressurized gas or fluid to press the heat transfer member 95 and the thermal conductor 85 against one another so that the temperature regulated surface 100 and the heat transfer surface 90 are brought into good thermal contact with each another. Preferably, the actuator 105 is capable of positioning and repositioning the heat transfer member 95 and the thermal conductor 85 to alternate between the thermally coupled and uncoupled positions at a commutation or pulse rate of least about 10 times a second, and more preferably at least about 60 times a second.

In the embodiment shown in FIGS. 2a and 2b, the actuator 105 comprises a hydraulic pressure activated system. The actuator 105 comprises a gas or fluid supply line 165, an isolation valve 170, an outlet 175 in the cover 120 of the thermal conductor 85, and a flexible pressure-activated membrane 185 over the outlet 175 and having a peripheral edge that forms a gas tight seal with an inner surface 180 of the cover 120. In operation, high pressure air is introduced into the volume of space enclosed by the membrane 185 and cover 120 to force the membrane 185 to flex and press against the heat transfer member 95, which in turn, causes the temperature regulated surface 100 to contact the heat transfer surface 90 of the thermal conductor 85.

The membrane 185 is shaped and sized to form a gas tight seal with the cover 120 and to provide sufficient flexibility to rapidly pulse the heat transfer member 95 between the thermally coupled and uncoupled positions. Preferably, the membrane 185 is sealed between the cover 120 and thermal insulator 130 by a raised lip or edge on the inner surface 180 of the cover 120 and a corresponding groove 188 in the top surface of the thermal insulator 130. The membrane 185 comprises a flexible material capable of withstanding the operational temperatures of the electronic device 40. Suitable materials include rubber, neoprene, polypropylene, and silicone, of which silicone is preferred because it has the requisite strength, flexibility, and resistance to damage by high temperatures. A suitable thickness for a silicone membrane is from about 0.5 to about 1.0 mm.

The isolation valve 170 comprises a valve or a set of valves capable of operating in a first mode to supply high pressure air to the outlet 175 to cause the membrane 185 to flex and press the heat transfer member 95 against the thermal conductor 85 to reach a heat coupling position, and in a second mode to vent or release the pressure of air behind the membrane 185 to enable the member 95 to return to an uncoupled position. The isolation valve 170 comprises a dual position valve that in a first position, connects the outlet 175 to a pressurized air supply; and in a second position, isolates the pressurized air supply while simultaneously venting air from behind the heat transfer member 185. Preferably, the isolation valve 170 is capable of being remotely operated by the controller 115. The isolation valve 170 may be a pneumatically operated valve or can be operated by an electric motor or solenoid.

Optionally, the actuator 105 may further comprise a biasing mechanism 190 that facilitates return of the heat transfer member 95 or the thermal conductor 85 to the uncoupled or coupling position when the pressure is released from the membrane 185. A suitable biasing mechanism 190 comprises one or more springs 195 located between the thermal conductor 85 and heat transfer member 95. The springs 195 are sized and located to enable them to quickly return the heat transfer member 95 to the uncoupled position, or vice versa. Preferably, the springs 195 are recessed into either the heat transfer member 95, the thermal conductor 85, or both, to enable the heat transfer surface 90 and the temperature regulated surface 100 to make contact and thermally couple across substantially their entire surface. In yet another embodiment, (not shown) the heat transfer member 95 is attached to membrane 185 at a central point of the membrane 185 and the heat transfer member 95 to allow the membrane 185 to serve as the biasing mechanism 190.

A spacer 200 or pad between the membrane 185 and the cover 120 cushions the returning heat transfer member 95. The spacer 200 is made of a resilient material that prevents the heat transfer member 95 from striking the cover 120 which could damage the temperature control head 25 or cause vibrations or noise in the automated chip tester 10 that interfere with testing of the electronic device 40. Suitable resilient materials include silicone, neoprene foam rubber, or Teflon.

A preferred controller 115 suitable for controlling one or more of the actuator 105, power to the heater 125, and heat exchanger 110 and for accepting temperature set points from a temperature sensor 110 will now be described. The controller 115 operates by comparing temperature output from the temperature sensor 110 to desired upper and lower limit temperatures that are programmed into the controller by an operator. Preferably, the controller 115 is mounted in or contiguous to the apparatus 10 and comprises a resistance bridge, including a fixed temperature resistor and a RTD sensor, to provide a signal voltage which changes as a function of the change in resistance of the temperature sensor 110.

In operation, the controller 115 compares the signal voltage to a preset reference voltage corresponding to a preset low temperature voltage. When the signal voltage is less than or equal to the preset low temperature voltage, the controller 115 energizes a relay to provide power to the heater 125 of the thermal conductor 85. If the signal voltage is above the preset low temperature voltage, the controller 115 operates the actuator 105 to rapidly pulse or alternate the thermal conductor 85 and heat transfer member 95 between thermally coupled (contact) and uncoupled (non-contact) positions. The controller 115 determines the frequency with which the thermal conductor 85 and heat transfer member 95 are alternated between thermally coupled and uncoupled positions and the duration of time in which they remain in the thermally coupled or uncoupled positions during each cycle. In one embodiment, the controller 115 calculates the frequency and duration from the signal voltage using an algorithm or dynamic model. Alternatively, the frequency and duration can be determined by comparing the signal voltage to values in a lookup table to determine the frequency at which the heat transfer member 95 and thermal conductor 85 are alternated between thermally coupled and uncoupled positions.

In addition, the controller 115 can comprise program code instructions to provide temperature measurements to the apparatus 10 to be recorded or factored into the results for each test of an electronic device 40. The controller 115 can also include program code instructions to halt testing and shut off power to the electronic device 40 when an over temperature condition is sensed. In this manner, the controller 115 serves as a safety power (on/off) control circuit that applies power to electronic device 40 only when the temperature of the electronic device 40 is below a predetermined maximum. The controller 115 can also comprise program code instructions to control the operation of the heat exchanger 160, including the pump for the heat transfer fluid, the chiller and fan, and a heater or refrigeration unit (not shown).

The following example demonstrates the capability of a temperature control head 25, according to the present invention, to quickly raise the temperature of the electronic device 40 undergoing testing to operating temperature, and to stabilize the temperature within a narrow range of temperatures despite rapid or relatively large changes in heat output from the device 40. In this example, the electronic device 40 undergoing testing was a microcomputer CPU chip. The microprocessor was held to the contact surface 45 of the temperature control head 25- using the vacuum system 33 as described above. Electrical power was applied to the microprocessor, and various read and write operations were performed utilizing varying amounts of microprocessor resources to generate a varying heat output.

The temperature control head 25 was used to maintain the temperature of the microprocessor to predetermined temperatures. The thermal conductor 85 comprised an aluminum box having a cover 120. A heater 125 having an output of about 120 Watts was used to heat the thermal conductor 85 to raise the thermal conductor 85 and the initially non-operating microprocessor to operating temperature. The heat transfer member 95, made of aluminum, was positioned in the cylindrical space between the thermal conductor 85 and cover 120. Fittings 150 on opposite sides of the heat transfer member 95 provided heat transfer fluid to the heat transfer member 95, and two cooling fins 155 which divide the volume enclosed by the heat transfer member 95 into a plurality of channels 135 having an S-shaped internal fluid flow path. The heat transfer member 95 was precooled to a temperature of 2° C. by flowing heat transfer fluid at a temperature of about 2° C. and at a flow rate of 2 liters/minute in the channels 135. The actuator 105 comprised a silicone membrane 185, an isolation valve 170, and a high pressure air supply 186 to move the heat transfer member 95 between thermally coupled and uncoupled positions. A RTD embedded in the contact surface 45 was used to monitor microprocessor temperature, and a 96A series temperature control head 115, commercially available from Watlon, Winona, Minnesota, was used to monitor temperature and control the frequency of the actuator 105.

In operation, the heater 125 was used to raise the temperature of the microprocessor to an operating temperature of about 70° C. Power was applied to the microprocessor and the controller 115 used to control the actuator 105 to alternate the heat transfer member 95 and thermal conductor 85 between thermally coupled and uncoupled positions. As the power applied to the microprocessor was raised from about 10 to about 50 Watts—increasing the heat output correspondingly—the heat transfer member 95 was rapidly pulsed between thermally coupling and non-coupling positions at a pulse rate of about 10 times a second. This experiment demonstrated that the temperature control head 25, according to the present invention, was able to maintain the temperature of a microprocessor chip within ±3° C. of a specified operating temperature of 70° C., despite widely varying heat loads of from 0 to 120 Watts applied to the microprocessor chip.

Although the present invention has been described in considerable detail with regard to the preferred versions thereof, other versions are possible. For example, the temperature control system can be used to control the temperature of a microprocessor in an actual operating environment, such as in a computer system. Therefore, the appended claims should not be limited to the description of the preferred versions contained herein.

What is claimed is:

1. A temperature control system for controlling a temperature of an electronic device, the temperature control system comprising a temperature regulated surface, and an actuator adapted to alternate the temperature regulated surface and the electronic device between thermally coupled and uncoupled positions at a rate sufficiently high to maintain the electronic device in a range of temperatures.

2. The temperature control system of claim 1 wherein the actuator is adapted to engage the temperature regulated surface and electronic device against one another in the thermally coupled position and disengage the temperature regulated surface and electronic device in the uncoupled position.

3. The temperature control system of claim 1 further comprising a temperature sensor capable of detecting the temperature of the electronic device, and wherein the actuator is adapted to alternate the temperature regulated surface and electronic device between the thermally coupled and uncoupled positions in relation to the temperature of the electronic device.

4. The temperature control system of claim 3 wherein the rate is at least about 10 times a second.

5. The temperature control system of claim 1 wherein the actuator comprises a pneumatic assembly.

6. The temperature control system of claim 1 wherein the pneumatic assembly comprises a pressure activated membrane.

7. The temperature control system of claim 1 further comprising a heater adapted to heat the electronic device.

8. The temperature control system of claim 1 further comprising a holding system adapted to hold the electronic device.

9. A temperature control head for controlling a temperature of an electronic device, the temperature control head comprising:
   (a) a thermal conductor having a contact surface adapted to contact the electronic device and having a heat transfer surface;
   (b) a heat transfer member comprising a temperature regulated surface; and
   (c) an actuator adapted to alternate the heat transfer surface and the temperature regulated surface between thermally coupled and uncoupled positions at a rate sufficiently high to maintain the electronic device in a range of predetermined temperatures.

10. The temperature control head of claim 9 wherein the actuator is adapted to engage the heat transfer surface and the temperature regulated surface against one another in the thermally coupled position and disengage the heat transfer surface and the temperature regulated surface in the uncoupled position.

11. The temperature control head of claim 9 further comprising a temperature sensor capable of detecting the temperature of the electronic device, and wherein the actuator is adapted to alternate the heat transfer surface and the temperature regulated surface between the thermally coupled and uncoupled positions at a rate selected in relation to the temperature of the electronic device.

12. The temperature control head of claim 9 wherein the actuator comprises a pneumatic assembly.

13. The temperature control head of claim 12 wherein the pneumatic assembly comprises a pressure activated membrane.

14. The temperature control head of claim 9 further comprising a biasing mechanism adapted to return the heat transfer surface or the temperature regulating surface to the thermally coupled or uncoupled positions.

15. The temperature control head of claim 9 further comprising a heater adapted to heat the thermal conductor.

16. The temperature control head of claim 9 further comprising a holding system adapted to hold the electronic device.

17. The temperature control system of claim 9 further comprising a biasing mechanism adapted to return the temperature regulated surface or the electronic device to the thermally coupled or uncoupled positions.

18. A temperature control head for controlling a temperature of an electronic device, the temperature control head comprising:

(a) means for holding the electronic device;

(b) means for controlling a temperature of a temperature regulated surface; and (c) means for alternating the temperature regulated surface and electronic device between a thermally coupled position in which heat transfer occurs therebetween, and an uncoupled position in which the heat transfer is reduced, and at a rate sufficiently high to maintain the electronic device in a range of temperatures.

19. The temperature control head of claim 18 wherein the rate is at least about 10 times a second.

20. The temperature control head claim of 18 wherein the means for alternating the temperature regulated surface and electronic device between the thermally coupled and uncoupled positions comprises a pneumatic assembly.

21. The temperature control head of claim 20 wherein the pneumatic assembly comprises a pressure activated membrane.

22. The temperature control head of claim 19 wherein the means for alternating the temperature regulated surface and the electronic device comprises biasing means for returning the temperature regulated surface or electronic device to the thermally coupled or uncoupled position.

23. The temperature control head of claim 18 further comprising a heater for heating the electronic device to a predetermined temperature.

24. A method of regulating a temperature of an electronic device, the method comprising the steps of:

(a) holding an electronic device against a thermal conductor;

(b) regulating the temperature of a heat transfer member; and (c) alternating the heat transfer member and the thermal conductor between a thermally coupled position in which the heat transfer member and the thermal conductor are thermally coupled to allow heat transfer therebetween, and an uncoupled position in which the heat transfer member and the thermal conductor are uncoupled to reduce heat transfer therebetween, and at a rate which is sufficiently high to maintain the electronic device in a range of temperatures.

25. A method according to claim 24 further comprising the step of measuring the temperature of the electronic device, and adjusting the rate at which the heat transfer member and the thermal conductor are alternated between the thermally coupled and uncoupled positions.

26. A method according to claim 24 further comprising the step of heating or cooling the thermal conductor to maintain the temperature of the electronic device at an operating temperature.

27. A method according to claim 24 comprising the step of circulating heat transfer fluid through channels in the heat transfer member.

28. A method of controlling the temperature of an electronic device, the method comprising the step of pulsing the electronic device and a heat transfer member between a thermal coupled position in which heat is transferred therebetween, and an uncoupled position in which the heat transfer is reduced, the pulsing rate being sufficiently high to maintain the electronic device in a range of temperatures.

29. A method according to claim 28 comprising the step of measuring the temperature of the electronic device and adjusting the pulsing rate in relation to the measured temperature.

30. A method according to claim 28 further comprising the initial step of maintaining the electronic device at an operating temperature.

31. A method according to claim 28 comprising the step of flowing heat transfer fluid through channels in the heat transfer member.

32. A method according to claim 28 wherein the pulsing rate is at least about 10 times a second.

* * * * *